United States Patent
Beppu

(10) Patent No.: US 9,461,214 B2
(45) Date of Patent: Oct. 4, 2016

(54) LIGHT EMITTING DEVICE WITH PHOSPHOR LAYER

(71) Applicant: NICHIA CORPORATION, Anan-shi, Tokushima (JP)

(72) Inventor: Suguru Beppu, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/554,202

(22) Filed: Nov. 26, 2014

(65) Prior Publication Data

US 2015/0155447 A1  Jun. 4, 2015

(30) Foreign Application Priority Data

Nov. 29, 2013 (JP) ................................ 2013-248621
Feb. 18, 2014 (JP) ................................ 2014-028860

(51) Int. Cl.
H01L 33/00 (2010.01)
H01L 33/50 (2010.01)
H01L 33/60 (2010.01)

(52) U.S. Cl.
CPC ........... *H01L 33/50* (2013.01); *H01L 33/0095* (2013.01); *H01L 33/60* (2013.01); *H01L 2933/0041* (2013.01)

(58) Field of Classification Search
CPC ..... H01L 33/50; H01L 33/60; H01L 33/005; H01L 2933/0041; H01L 2933/0033; H01L 2933/0058
USPC ...................................... 257/81, 98, 99, 100
See application file for complete search history.

(56) References Cited

U.S. PATENT DOCUMENTS

| 7,569,406 B2 * | 8/2009 | Keller et al. ..................... 438/27 |
| 8,058,088 B2 * | 11/2011 | Cannon et al. .................. 438/48 |
| 2005/0072981 A1 | 4/2005 | Suenaga |
| 2010/0060157 A1 * | 3/2010 | Shi ........................ H01L 33/507 313/512 |
| 2012/0142124 A1 | 6/2012 | Yoo et al. |
| 2012/0248483 A1 | 10/2012 | Beppu et al. |
| 2013/0037842 A1 | 2/2013 | Yamada et al. |
| 2013/0135834 A1 | 5/2013 | Horikawa et al. |

FOREIGN PATENT DOCUMENTS

| JP | 2003-115614 A | 4/2003 |
| JP | 2003-318448 A | 11/2003 |
| JP | 2004-181140 A | 7/2004 |
| JP | 2009-188274 A | 8/2009 |
| JP | 2012-119673 A | 6/2012 |
| JP | 2012-182215 A | 9/2012 |
| JP | 2012-256848 A | 12/2012 |
| JP | 2013-138182 A | 7/2013 |
| JP | 2013-168528 A | 8/2013 |
| WO | 2011-099384 A1 | 8/2011 |
| WO | 2013-054658 A1 | 4/2013 |

* cited by examiner

*Primary Examiner* — Hung Vu
(74) *Attorney, Agent, or Firm* — Global IP Counselors, LLP

(57) ABSTRACT

A method for manufacturing a light emitting device, having; a die bonding step of mounting a light emitting element on a board; a phosphor layer formation step of forming a phosphor layer that contains a phosphor by spraying on surfaces of the board and the light emitting element after the die bonding step; and a cover layer formation step of forming a cover layer that contains at least one type of light reflecting material and light blocking material on a surface of the phosphor layer over the board.

12 Claims, 9 Drawing Sheets

LIGHT EMITTING DEVICE WITH PHOSPHOR LAYER

CROSS-REFERENCE TO RELATED APPLICATIONS

This application claims priority to Japanese Patent Applications Nos. 2013-248621 and 2014-028860 filed on Nov. 29, 2013 and Feb. 18, 2014, respectively. The entire disclosure of Japanese Patent Applications Nos. 2013-248621 and 2014-028860 is hereby incorporated herein by reference.

BACKGROUND

1. Technical Field

The present disclosure relates to a method for manufacturing a light emitting device, and to a light emitting device, in which a phosphor layer is formed on the surface of a light emitting element.

2. Related Art

It is generally known that a light emitting device in which a light emitting element is used is compact, has good power efficiency, and emits light in clear colors. Since the light emitting element pertaining to this light emitting device is a semiconductor element, not only is there no worry about bulbs burning out and so forth, but the initial drive characteristics are excellent, and the device is resistant to vibration and repeated switching on and off. Because of these excellent characteristics, light emitting devices that make use of light emitting diodes (LED), laser diode (LD), or other such light emitting elements are utilized in various kinds of light source.

The most popular method for producing a white LED, for example, is to coat the area around an LED element that emits blue light, with a yellow phosphor that turns the blue light from the LED element into excitation light. As such a method for forming a phosphor on the surface of an LED element, a technique has been disclosed in which a phosphor layer (wavelength conversion layer) of a light emitting device is formed by spray coating, thereby forming a phosphor layer in a uniform thickness (uniform phosphor coating) over the LED element (see, WO2013/054658).

With a light emitting device in which a phosphor layer is formed, light distribution characteristics close to those of a point light source can be obtained by forming the phosphor layer extremely close to the light emitting element. When a light emitting device as a point light source is used, because it has a small emission surface area, it is easier to design an applied product that incorporates this light emitting device. Accordingly, light emitting devices used as a point light source are expected to use in the field of lighting and many other fields.

SUMMARY

With a light emitting device, when a phosphor layer is formed by spray coating, for example, the phosphor adhere widely over the substrate on which the light emitting element is mounted. Even if the phosphor is applied carefully so as to be concentrated as much as possible around the light emitting element, some of the phosphor may still stick to the substrate around the light emitting element. Accordingly, the phosphor layer is merely formed by spraying onto the surface of the light emitting element, the phosphor may emit light at portions other than the surface of the light emitting element. The benefit of a point light source is therefore reduced, so it may be difficult to make a light emitting device into a point light source. Furthermore, there is a need to develop a light emitting device that is improved in terms of increasing reflectivity.

In light of this situation, it is an object of the present disclosure to provide a light emitting device, and a method for manufacturing a light emitting device, which is good in terms of being a point light source, or with which reflectivity of an area near the light emitting element can be increased.

One aspect of the present disclosure relates to a method for manufacturing a light emitting device. The method includes a die bonding step of mounting a light emitting element on a board; a phosphor layer formation step of forming a phosphor layer that contains a phosphor by spraying on surfaces of the board and the light emitting element after the die bonding step; and a cover layer formation step of forming a cover layer that contains at least one type of light reflecting material and light blocking material on a surface of the phosphor layer over the board.

Another aspect of the present disclosure also relates to a light emitting device. The light emitting device has a board; a light emitting element mounted on the board; a phosphor layer in a substantially uniform thickness composed of a plurality of layers formed on surfaces of the light emitting element and the board; and a cover layer that covers the phosphor layer over the board and contains at least one type of light reflecting material and light blocking material.

Still another aspect of the present disclosure relates to a method for manufacturing a light emitting device. The method includes a die bonding step of mounting a light emitting element on a board; a cover layer formation step of forming a cover layer that contains at least one type of light reflecting material and light blocking material at a place on the board where the light emitting element is not mounted after the die bonding step; and a phosphor layer formation step of forming a phosphor layer that contains a phosphor by spraying on surfaces of the light emitting element and the cover layer after the cover layer formation step.

Other aspect of the present disclosure also relates to a light emitting device. The light emitting device has a board; a light emitting element mounted on the board; a cover layer that contains at least one type of light reflecting material and light blocking material at a place on the board where the light emitting element is not mounted; and a phosphor layer in a substantially uniform thickness composed of a plurality of layers formed on surfaces of the light emitting element and the cover layer.

With the method for manufacturing a light emitting device pertaining to the present disclosure, a light emitting device can be manufactured in which there is no emission from any phosphor near the light emitting element. Consequently, a light emitting device that is good in terms of being a point light source can be manufactured.

With the light emitting device pertaining to the present disclosure, a light emitting device that is good in terms of being a point light source can be obtained by preventing emission from any phosphor near the light emitting element.

Also, a light emitting device that has good light extraction efficiency can be manufactured by increasing reflectivity near the light emitting element.

With the light emitting device pertaining to the present disclosure, a light emitting device with good light extraction efficiency can be obtained by increasing reflectivity near the light emitting element.

BRIEF DESCRIPTION OF DRAWINGS

FIG. 1b is an X-X cross sectional view of FIG. 1a;

FIG. 4b is a Y-Y cross sectional view of FIG. 4a;

FIG. 6b is an X-X cross sectional view of FIG. 6a;

FIG. 8b is a Y-Y cross sectional view of FIG. 8a.

DETAILED DESCRIPTION OF THE DISCLOSURE

Figure 1A:
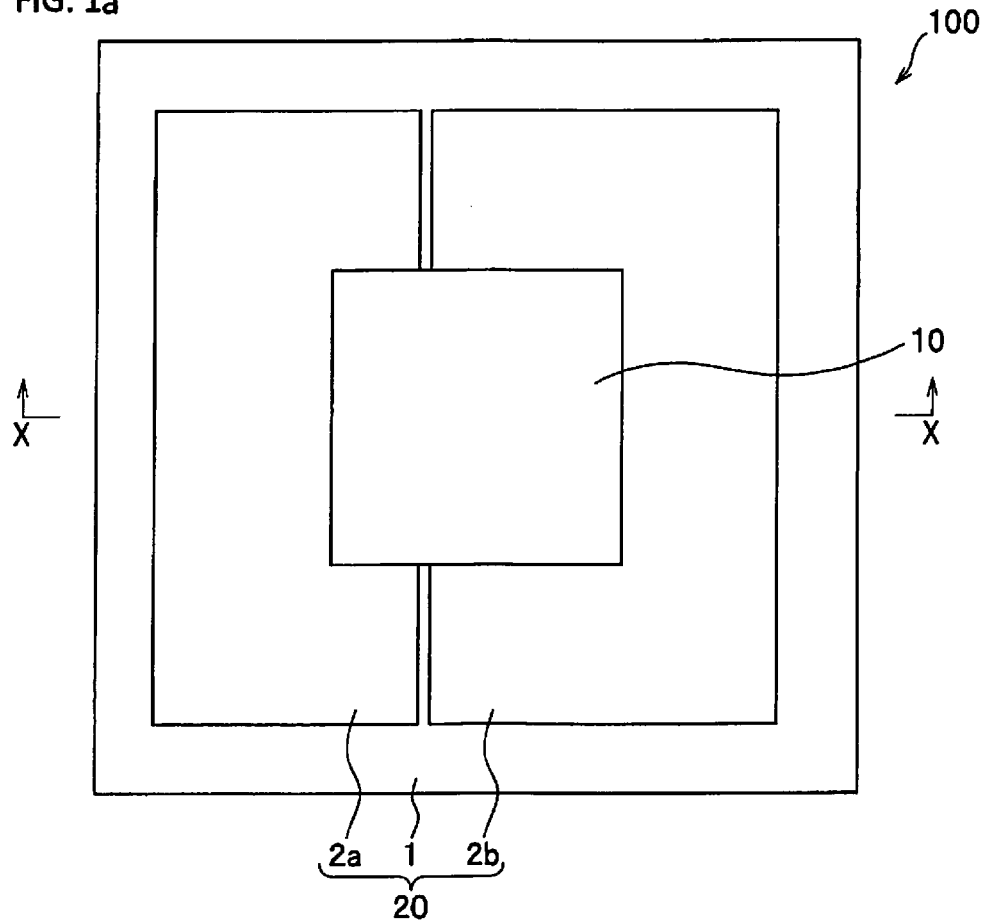
FIG. 1a is a simplified plan view of the light emitting device pertaining to one embodiment of the present disclosure.

Embodiments for implementing a method for manufacturing a light emitting device and a light emitting device of the present disclosure will be described below with reference to the accompanying drawings. The sizes and the arrangement relationships of the members in each of drawings are occasionally shown exaggerated for ease of explanation. Further, in the description below, the same designations or the same reference numerals can, in principle, denote the same or like members and duplicative descriptions will be appropriately omitted.

Embodiment 1

Light Emitting Device

Figure 1B:
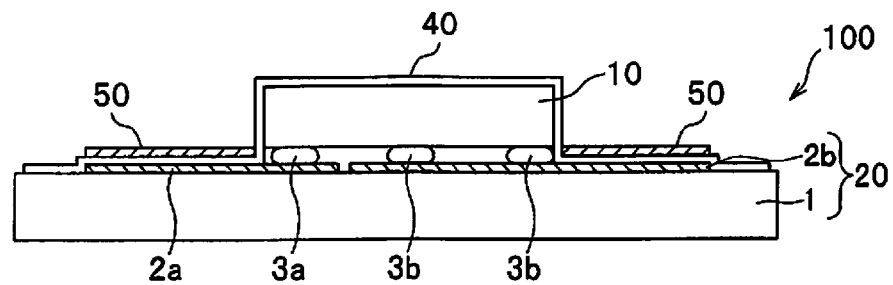

As shown in FIGS. 1a and 1b, a light emitting device 100 here mainly includes a base 1, conductive members 2a, 2b provided on the base 1, bumps 3a and 3b provided on the conductive members 2a, 3b, a light emitting element 10 provided on the bumps 3a and 3b, a phosphor layer 40 provided to the surface of the light emitting element 10 and the surface of a board (mounting board) 20, and a cover layer 50 that covers the phosphor layer 40 on the mounting board 20. The mounting board 20 here has the base 1 and the conductive members 2a, 2b. In order to facilitate an understanding of the configuration of the light emitting device of the present embodiment, the phosphor layer 40 and the cover layer 50 shown in FIG. 1b are not shown in FIG. 1a.

Mounting Board

As shown in FIGS. 1a and 1b, the mounting board 20 is a board on which the light emitting element 10 and other such electronic parts are mounted, and here includes the base 1 and the conductive members 2a, 2b that are provided on the base 1.

As shown in FIG. 1a, the mounting board 20 (or the base 1) here is formed in a rectangular, flat shape. There are no particular restrictions on the size or shape of the mounting board 20 (or the base 1), which can be suitably selected as dictated by the purpose and application, such as the number of light emitting elements 10 and the arrangement spacing.

Base

The base 1 is a member on which the light emitting element 10 and other such electronic parts are mounted via the conductive members 2a, 2b. An electrically insulating material is preferably used as the material of the base 1, and it is preferable to use a material that tends not to transmit light emitted from the light emitting element 10 or light emitted from the phosphor layer 40, etc. It is also preferable to use a material with a certain amount of strength. More specifically, examples include a ceramic ($Al_2O_3$, AlN, etc.) or a resin, or a member in which an insulating layer is provided to the surface of a metal board. Among ceramics, a low temperature co-fired ceramic (LTCC) is preferably used because it tends to raise the light reflectivity.

Conductive Members

The conductive members 2a, 2b are members that electrically connect the light emitting element 10 and other such electronic parts to the outside of the light emitting device, and that are used to supply current (electrical power) from the outside to these electronic parts. The material of the conductive members 2a, 2b can be suitably selected according to the method for manufacturing the light emitting device 100, etc. Examples includes copper, aluminum, gold, tungsten, iron, nickel, molybdenum and other metal, or alloy of iron and nickel, phosphor bronze, copper containing iron and other alloy.

The conductive members 2a, 2b may also function as heat dissipation paths. To improve heat dissipation, it is preferable to provide these over a wide surface area; for example, if the base 1 is rectangular, they are provided in a large width in the short-side direction of the base 1. In FIG. 1a, they are provided in a large width in the up and down direction of the drawing.

A metal member for increasing the efficiency of light reflection at the conductive members 2a, 2b can be provided to the surface of the conductive members 2a, 2b. There are no particular restrictions on the material of this metal member, but examples include silver alone, or an alloy of silver and copper, gold, rhodium, or another metal with high reflectivity. A multilayer film in which silver or any of various alloys is used can also be used. The metal member can be provided by plating, sputtering, vapor deposition, the joining of a thin-film, or another such method.

Bumps (Also Sometimes Referred to as a Conductive Adhesive)

The bumps 3a and 3b are members that electrically connect the conductive members 2a, 2b to the electrodes of the light emitting element 10. Any conventional bumps can be used, such as stud bumps, plating bumps, or solder. Gold or an alloy thereof is often used for the material of stud bumps. The material of plating bumps can be gold alone, or a laminate structure in which copper or nickel is used as a base and the surface is gold. The bumps 3a and 3b are from 10 to 20 μm thick, for example.

Light Emitting Element

The light emitting element 10 has positive and negative electrode pads on the face that is on the opposite side from the emission face (FIG. 1b), on the side where the bumps 3a and 3b are connected, and is connected to the conductive members 2a, 2b via the bumps 3a and 3b, and mounted on the base 1 (on the mounting board 20). Here, the n-side electrode is connected to the conductive member 2a (negative electrode) via the bump 3a, while the p-side electrode is connected to the conductive member 2b (positive electrode) via the bumps 3b. The emission face is on the opposite side from the face on the side facing the base 1 when mounted to the mounting board 20, and is on the light extraction direction side of the light emitting device 100.

The light emitting element 10 can be a light emitting diode having on a growth substrate a semiconductor layer having an n layer, a p layer, and an active layer that performs light emission, in a shape having an edge on the upper face, such as a substantially cuboid shape. The wavelength of the light emitting element 10 can be selected as desired. For instance, ZnSe, a nitride semiconductor ($In_XAl_YGa_{1-X-Y}N$, where $0 \leq X$, $0 \leq Y$, and $X+Y \leq 1$), GaP, or the like can be used for a blue (light with a wavelength of 430 to 490 nm) or green (light with a wavelength of 490 to 570 nm) light emitting element 10, and GaAlAs, AlInGaP, or the like can be used for a red light emitting element 10 (light with a wavelength of 620 to 750 nm).

In a case where the light emitting device 100 makes use of a YAG based phosphor substance, a nitride semiconductor capable of emitting light with a short wavelength that can efficiently excite this fluorescent substance ($In_XAl_YGa_{1-X-Y}N$, where $0 \leq X$, $0 \leq Y$, and $X+Y \leq 1$) is preferable. Various emission wavelengths can be selected by adjusting the material of the active layer or the mixed crystal thereof. Furthermore, the light emitting element 10 can be composed of materials other than these. The composition of the light emitting element 10 being used, as well as its emission color, size, number of elements, and so forth can be suitably selected according to the intended application.

The light emitting element 10 preferably has a translucent substrate (such as sapphire) on the light extraction side.

The light emitting element 10 can be made to output in the visible band, ultraviolet light or infrared light.

The light emitting device 100 can also be made into a white LED element by combining a blue light emitting element and a phosphor which emits yellow light.

With the present embodiment, the light emitting element 10 can be configured so that it has no growth substrate. For example, a semiconductor layer composed of an n layer, an active layer, and a p layer can be grown on a growth substrate, and then the growth substrate can be removed from the semiconductor layer by a laser liftoff method, the MeTRe method (Mechanical transfer using a release layer), a chemical liftoff method, or another such method.

Phosphor Layer

The phosphor layer 40 is a layer containing a phosphor and formed on and covers the surface of the light emitting element 10 and the mounting board 20. The phosphor layer 40 can be formed on the surface of the light emitting element 10, but as described in the Prior Art section above, in a case where the phosphor layer 40 is formed by spray method, may be the phosphor layer 40 formed on the surface of the mounting board 20 as well. Accordingly, the phosphor layer 40 here is also formed on the surface of the mounting board 20 other than the place where the light emitting element 10 is installed. However, the surface area of the phosphor layer 40 on the mounting board 20 is preferably as small as possible.

The phosphor layer 40 is formed by spray coating with a slurry obtained by mixing a phosphor, a resin, and a solvent, for example. The phosphor layer 40 can be a phosphor mixed with a resin or the like, or it can be formed from a phosphor alone. In FIG. 1b, the phosphor layer 40 contains a resin, etc. (not shown). Adding a resin to the phosphor layer 40 makes it easier for the phosphor to stick to the surface of the light emitting element 10.

The thickness of the phosphor layer is from 10 to 200 μm for example.

The phosphor contained the phosphor layer 40 is a fluorescent member that emits light having different wavelengths by absorbing at least part of the light from the light emitting element 10 as a wavelength conversion member.

The material of the phosphor can be a yttrium aluminum garnet (YAG)-based phosphor, or a nitride phosphor, an oxynitride phosphor, or the like that is primarily activated by europium, cerium, or another such lanthanoid element. For instance, with a blue light emitting element, a YAG-based phosphor, an LuAG-based phosphor, a silicate phosphor of $M_2SiO_4$:Eu (M is Sr, Ca, Ba, etc.), or a combination thereof that emit green to yellow light, or, an SCASN-based phosphor such as $(Sr,Ca)AlSiN_3$:Eu, a CASN-based phosphor such as $CaAlSiN_3$:Eu, or $SrAlSiN_3$:Eu, a KSF phosphor, or the like that emit red light for the purpose of further enhanceing color expression can be used in combinations and blend ratios suited to the desired coloring.

The phosphor layer 40 composed of a plurality of layers formed in a substantially uniform thickness on the surface of the light emitting element 10 and the mounting board 20. As discussed below, since the phosphor layer 40 is formed by spraying, it has a structure in which a plurality of layers is laminated. The number of layers can be from 1 to 20, for example, and the thickness of each layer can be from 5 to 20 μm, for example. The thickness of the layers constituting the phosphor layer 40 is preferably uniform, but there can be some unevenness attributable to minute differences occurring variation in manufacturing, or to the particle size of the phosphor. The thickness of the layers constituting the phosphor layer 40 can vary from one layer to other layers. The color yield can be increased by forming the phosphor layer 40 through lamination of a plurality of layers.

The phosphor layer 40 covers the surface of the light emitting element 10, and may be provided at a place on the surface of the mounting board 20 where the light emitting element 10 is not mounted. The "place where the light emitting element 10 is not mounted" referred to here is a place other than directly under the light emitting element 10 on the surface of the mounting board 20. That is, it is a place outer periphery of the light emitting element 10 in a plan view.

Cover Layer

The cover layer 50 is a light reflecting and/or light blocking layer, and covers the phosphor layer 40 on the mounting board 20 in the present embodiment.

The cover layer 50 contains at least one type of light reflecting material that reflects at least part of the light from the light emitting element 10 or light blocking material. Examples of the light reflecting materials include $SiO_2$, $Al_2O_3$, $TiO_2$, $ZrO_2$, $BaSO_4$, MgO. One or more types of light reflecting material can be contained. Examples of the light blocking materials include carbon black and darkly colored resin materials. One or more types of light blocking material can be used. In addition to the light reflecting and/or light blocking material, the cover layer 50 can also contain a binder, a color fixative, a light diffusing agent, or a filler as needed. Also, the cover layer 50 can be formed as a single member, or it can be formed as two or more layers.

In this embodiment, the cover layer 50 is provided on the surface of the phosphor layer 40 over the conductive members 2a, 2b. Here, of the phosphor layer 40 provided to the mounting board 20, the cover layer 50 is provided at a location near the light emitting element 10. Specifically, the cover layer 50 is provided so as to be located around the light emitting element 10. The phrase "around the light emitting element 10" refers to a place that is near the light emitting element 10 and where emission by the phosphor on the mounting board 20 is prevented, and the desired point light source attributes can be obtained.

Providing the cover layer 50 on the surface of the phosphor layer 40 over the conductive members 2a, 2b prevents the phosphor from emitting light near the light emitting element 10 except at the surface of the light emitting element 10, resulting in a light emitting device with better point light source attributes. Also, in a case where the cover layer 50 reflects light, this improves the reflectivity of the area near the light emitting element 10. These effects are further improved by providing the cover layer 50 near the light emitting element 10.

The thickness of the cover layer 50 is from 10 to 30 μm, for example. The cover layer 50 maybe thicker than the bumps 3a and 3b.

In a case where the cover layer 50 is formed on the conductive members 2a, 3b, it is preferably made of an electrically insulating material.

Figure 3:
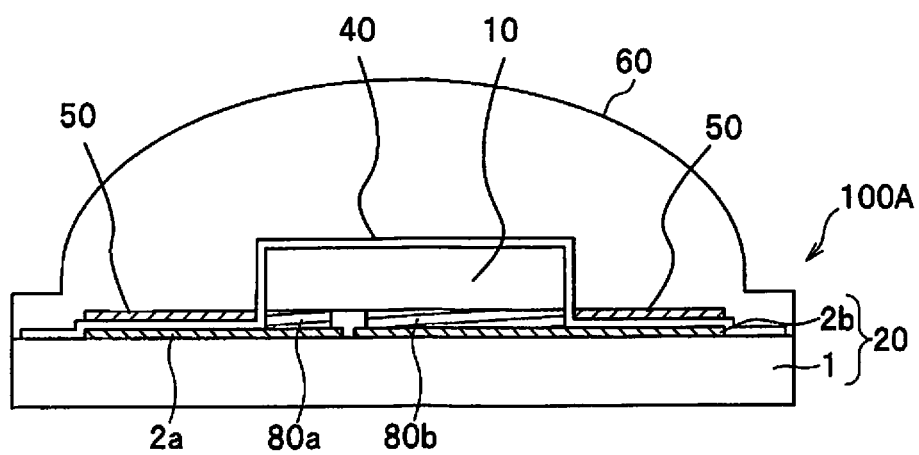
FIG. 3 is a simplified cross section of the light emitting device pertaining to another embodiment of the present disclosure.

The light emitting element 10, the phosphor layer 40, and the cover layer 50 described above are preferably sealed with a translucent resin or other such sealing member 60, as shown in FIG. 3, for example. The sealing member 60 can be in any shape, and shapes such as those that combine a substantially cuboid shape, a hemispherical shape, and a plurality of hemispheres can be used according to the characteristics needed in the light emitting device.

With the light emitting device 100 of the present embodiment described above, when the light emitting device 100 is driven, of the light traveling in all directions from the light emitting element 10, the light that is traveling upward is extracted to the outside above the light emitting device 100. The light traveling downward, to the side, etc., is reflected or scattered by the cover layer 50, the surface of the base 1, the conductive members 2a, 3b, a resist film, etc., and is extracted to the outside above the light emitting device 100. Also, emission by phosphor on the mounting board 20 near the light emitting element 10 can be reduced, which improves the point light source attributes. Furthermore, in a case where the cover layer 50 is reflective, reflectivity of the area near the light emitting element 10 can be increased, and the light extraction efficiency of the light emitting device 10 can be improved.

Method for Manufacturing Light Emitting Device

The method for manufacturing the light emitting device 100 pertaining to the present embodiment includes a die bonding step, a phosphor layer formation step, and a cover layer formation step, in that order. Here, a board preparation step is also included before the die bonding step.

Board Preparation Step

The board preparation step is a step of preparing a board (mounting board) 20 equipped with the conductive members 2a, 3b, and is a step of forming the conductive members 2a, 2b on the base 1, for example. The formation of the conductive members 2a, 2b can be accomplished by a known method, such as forming it by plating, vapor deposition, or affixing to the base 1. If the members are affixed to the base 1, the base 1 and the conductive members 2a, 2b can be bonded with a resin or another such adhesive agent. The conductive members 2a, 2b can be formed by etching or the like after forming the material of the conductive members 2a, 2b on one side of the base 1.

Die Bonding Step

The die bonding step is a step of mounting the light emitting element 10 on the mounting board 20. In this die bonding step, the light emitting element 10 is mounted on the upper face of the conductive members 2a, 2b.

There are no particular restrictions on the method for mounting the light emitting element 10, and any method can be employed. For instance, the light emitting element 10 and the conductive members 2a, 2b can be joined with solder such as Au—Sn, Sn—Ag—Cu, or the like, or with an epoxy resin containing a conductive material, etc.

In this embodiment, flip-chip mounting is used, in which the conductive member 2a is connected to the n-side electrode of the light emitting element 10 via the bump 3a, and the conductive member 2b is connected to the p-side electrode of the light emitting element 10 via the bumps 3b. More specifically, the bumps 3a and 3b are bonded to the conductive members 2a, 2b and the electrode pads of the light emitting element 10 by ultrasonic bonding.

Phosphor Layer Formation Step

The phosphor layer formation step is a step of forming the phosphor layer 40 that contains a phosphor by spraying on the surface of the light emitting element 10 and the mounting board 20 after the mounting of the light emitting element 10. Spraying is used to form the phosphor layer 40. Spraying allows the phosphor layer 40 to be formed in a substantially uniform thickness on the surface of the light emitting element 10 and the mounting board 20. If a slurry containing a phosphor is used as the sprayed material, this will prevent scattering of the material and make the spraying easier, and will also help the phosphor to adhere more uniformly to the light emitting element 10.

Pulse spraying is preferably used as the spray method. Pulse spraying is a technique that use air pressure to intermittently discharge (pulse spray) a resin in which particles of a phosphor or the like are mixed for forming a uniform layer contains particles In a case when continuous coating is performed with an ordinary spray method, the coating tends to go on heavy and the material tends to scatter, so the nozzle speed has to be raised. On the other hand, since pulse spraying involves intermittent discharge, the coating amount per unit of time is smaller, the nozzle can be moved more slowly, and the coating solution can more easily penetrate into tiny spaces and reach the side faces of the light emitting element 10.

Another advantages of pulse spraying include (1) a uniform film can be formed even if the coated surface is uneven, (2) the coating solution can have good adhesion and tends to adhere even to the side faces and edges of the light emitting element, (3) color adjustment can be done with minute amounts of coating (measuring the coloring while coating step), (4) the type of phosphor is not restricted, affording greater latitude in selecting a member, and (5) a coating film with high light quality and good color stability can be formed (for example, the range of color variance of the manufactured light emitting device can be kept to within MacAdam 2-step (within MacAdam 3-step, light emitting devices have substantially no color variance to the human eye)).

Next, a pulse sprayer will be described briefly through reference to FIG. 2.

Figure 2:
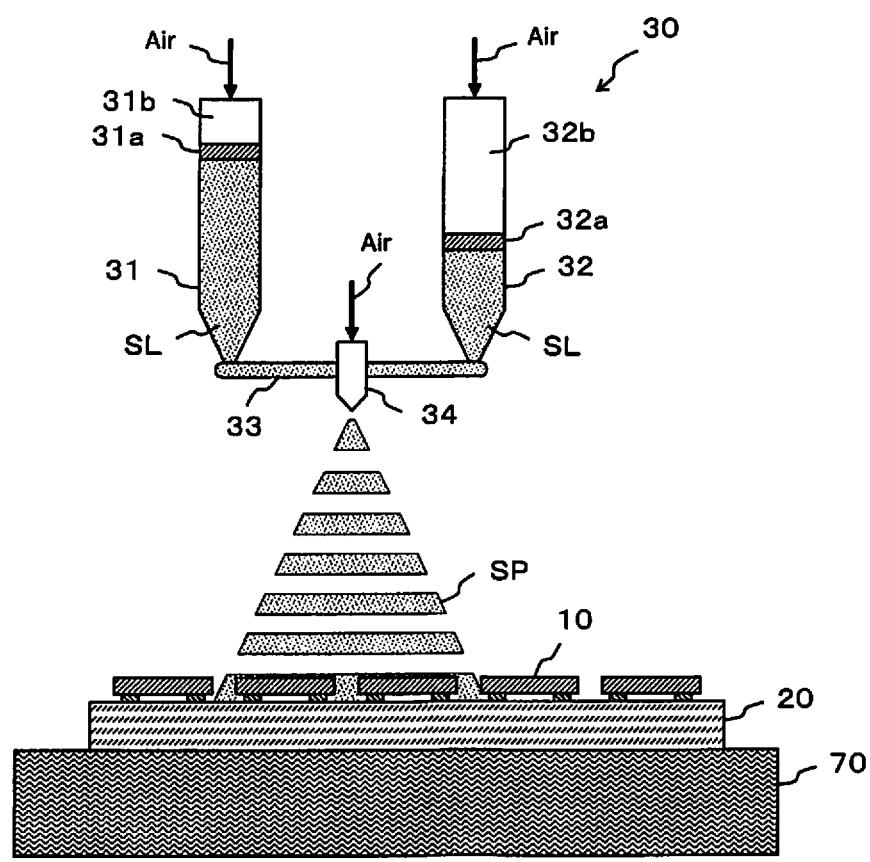
FIG. 2 is a simplified diagram illustrating pulse spraying in which a pulse sprayer is used.

As shown in FIG. 2, a pulse sprayer 30 in this embodiment mainly includes syringes 31 and 32 that hold a slurry SL, a tube 33 that connects the syringes 31 and 32 together, and a spray nozzle 34 that sprays out the slurry SL.

The slurry SL, which is a mixture of a solvent, a resin, and particles of a phosphor, is held inside the syringes 31 and 32. The syringes 31 and 32 are connected to an air compressor (not shown) for supplying air, and this keeps compressed gases 31b and 32b at a specific pressure inside the syringes 31 and 32.

Also, plungers 31a and 32a are provided inside the syringes 31 and 32, between the slurry SL and the compressed gases 31b and 32b. The plungers 31a and 32a keep the slurry SL separate from the compressed gases 31b and 33b, so dissolution of the compressed gases 31b and 32b in the slurry SL can be reduced.

The tube 33 as a fluid channel is connected to the spray nozzle 34. The spray nozzle 34 is also connected to an air compressor (not shown) for supplying air. The angle of the spray nozzle 34 is adjustable, allowing the nozzle to be angled with respect to a holder 70.

In spraying of this embodiment, first the discharge valve of the spray nozzle 34 is shut off, and then air is supplied at a predetermined pressure from the air compressor to the syringe 31. This air supply pressurizes the slurry SL contained in the syringe 31, and pumps it through the tube 33 (flow path) toward the syringe 32. After this, when air is similarly supplied at a predetermined pressure to the syringe 32, the slurry SL contained in the syringe 32 is pressurized and is pumped through the tube 33 (flow path) toward the syringe 31. This process is repeated to agitate the slurry SL as it moves between the syringes 31 and 32. This helps keep particles with a high specific gravity from settling, and holds the particles in a state of being dispersed in the slurry SL.

When the slurry SL is applied, the discharge valve of the spray nozzle 34 is opened, and air is intermittently supplied at a predetermined pressure from the air compressor to the spray nozzle 34. While the air is being supplied, the slurry SL can be intermittently discharged by opening a valve provided between the air compressor and the spray nozzle 34. This causes the slurry SL to be intermittently sprayed out along with air from the tip of the spray nozzle 34, and sprayed (labeled SP in the drawing) onto the light emitting element 10.

An Example of the method for forming a phosphor layer by pulse spraying will now be described through reference to FIG. 2.

First, a slurry into which a phosphor has been mixed (a phosphor slurry) is prepared. This phosphor slurry can be a mixture of a phosphor, a resin, and a solvent, such as a mixture of a phosphor, a silicone resin, and n-heptane. The mixing ratio of the phosphor slurry is preferably such that phosphor/resin/solvent=(2 to 40)/(5 to 20)/(10 to 200), as a weight ratio. This mixing ratio will make the slurry easier to spray and will help the phosphor to adhere uniformly to the light emitting element. This mixing ratio can also be applied preferably to spray methods other than pulse spraying.

Next, after being thoroughly agitated and mixed, the phosphor slurry is put into the syringes 31 and 32 of the pulse sprayer 30. The phosphor slurry is then moved between the syringes 31 and 32 to agitate it, and is applied by pulse spraying. Here, the spray nozzle 34 is moved during coating so that the upper and side faces of the light emitting element 10 can be coated with the phosphor slurry as uniformly as possible.

After coating with the phosphor slurry, the resin is temporary cured to form a layer of phosphor. Then, this layer is coated with the phosphor slurry by the same method and temporary cured to form a second phosphor layer. This process is repeated to form layers of phosphor up to the thickness at which emission in the desired color will be obtained. The phosphor layer 40 is thus formed from a plurality of layers.

Cover Layer Formation Step

The cover layer formation step is a step of forming the cover layer 50 that contains at least one type of light reflecting material and/or light blocking material on the surface of the phosphor layer 40 over the mounting board 20.

There are no particular restrictions on the method for forming the cover layer 50, but forming it by electrophoretic coating or electrostatic coating is preferable.

With electrophoretic coating, the mounting board 20 on which the light emitting element 10 is mounted, and which serves as one electrode, and a counter electrode (the other electrode) are immersed in an electrophoretic tank containing a solution in which a light reflecting and/or light blocking material has been suspended, and voltage is applied between the electrodes. Voltage of a different polarity from that with which the light reflecting and/or light blocking material is charged is applied on the mounting board 20 side. Consequently, the light reflecting and/or light blocking material undergoes electrophoresis and adheres to the surface of the phosphor layer 40 over the conductive members 2a, 2b of the mounting board 20. Here, in a case where the light emitting element 10 is an insulator, the light reflecting and/or light blocking material will not adhere to the light emitting element 10. On the other hand, in a case where the light emitting element 10 is a conductor, the light emitting element 10 may be masked, or the method discussed below may be used. The thickness of the cover layer 50 can be controlled by adjusting the coulombs, which are determined by the time and current flowing between the electrodes.

There are no particular restrictions on the solvent used in this electrophoretic coating, but IPA (isopropyl alcohol) or another such alcohol-based solvent can be used to advantage.

The cover layer 50 does not have to be formed by electrophoretic coating or electrostatic coating, and centrifugal deposition or spraying can also be used. Furthermore, the above methods can be combined. In particular, when the cover layer 50 is formed at a place where the conductive members 2a, 2b are not formed, centrifugal deposition or spraying may be used. Also, a mask can be used to keep the cover layer 50 from being formed where not needed.

In the above embodiment, however, the light emitting device and the method for manufacturing the light emitting device that embody the technological concept of the present embodiment are just examples, and unless otherwise specified, the dimensions, materials, shapes, relative layout, and so forth of the constituent parts discussed in the embodiment are not intended to limit the scope of the present invention, and are merely examples given for the sake of illustration.

Embodiment 2

As shown in FIG. 3, a light emitting device 100A is such that the conductive members 2a, 2b and the light emitting element 10 are joined by joining members 80a and 80b.

With the light emitting device 100 discussed above, the light emitting element 10 is placed on the conductive members 2a, 2b with the bumps 3a and 3b in between them. As shown in FIG. 3, however, the joining members 80a and 80b can be used to place the light emitting element 10 on the conductive members 2a, 2b by eutectic bonding or resin bonding.

Examples of the material used in eutectic bonding include alloys whose main components are gold and tin, alloys whose main components are gold and silicon, and alloys whose main components are gold and germanium. Of these, AuSn is particular preferable. The material used for resin bonding can be a resin containing a conductive material.

Embodiment 3

Figure 4A:
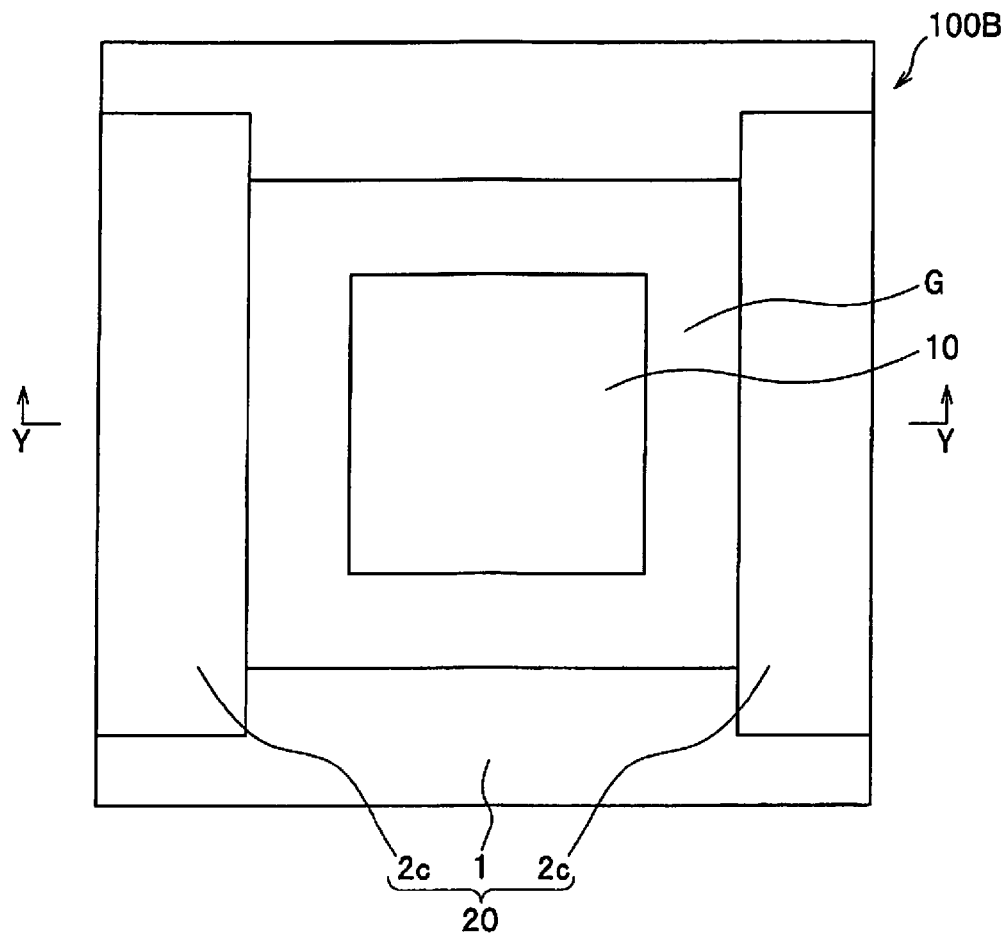
FIG. 4a is a simplified plan view diagram of the light emitting device pertaining to another embodiment of the present disclosure.
Figure 4B:
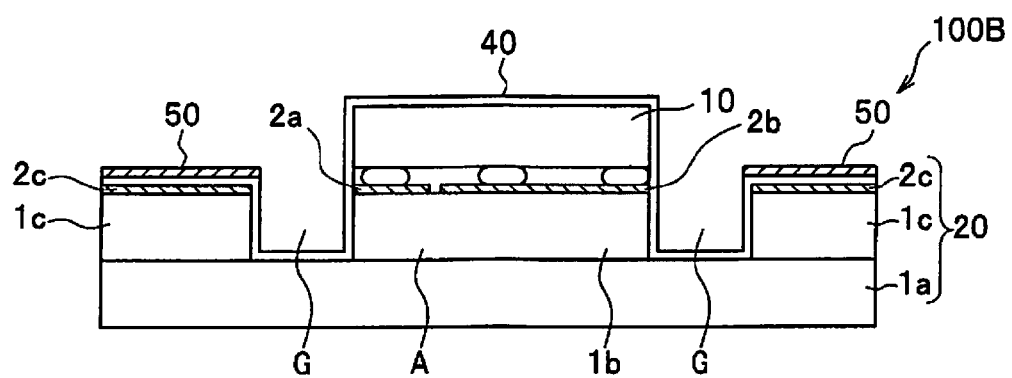

As shown in FIGS. 4a and 4b, a light emitting device 100B has a mounting portion A on which the board (mounting board) 20 is mounted, and a groove G formed surrounding the outer periphery of the mounting portion A. The mounting board 20 here is made of the base 1 (1a, 1b, and 1c) and conductive members 2a, 3b, and 2c. The phosphor layer 40 and the cover layer 50 that are shown in FIG. 4b are not shown in FIG. 4a in order to make the configuration of the present embodiment easier to understand. The phrase "the outer periphery of the mounting portion A" here refers to an area near the light emitting element 10, which surrounds the four sides of the light emitting element 10 on the board 20, in a plan view. Also, in this embodiment, the base 1c are also located around the outer periphery of the light emitting element 10, and are included in the concept of "near the light emitting element 10."

The light emitting device 100B thus has the groove G formed in the mounting board 20 around the outer periphery of the light emitting element 10, which makes the emission of light less likely around the outer periphery of the light emitting element 10, and affords better point light source attributes. The light emitting device 100B also has the cover layer 50 formed on the upper faces of the phosphor layer 40 on the base 1c around the outer periphery of the groove so the point light source attributes are improved, and in a case where the cover layer 50 is reflective, there is an increase in reflectivity of the area near the light emitting element 10.

There are no particular restrictions on the surface area of the upper face of the mounting portion A, but it can be equal to or less than the surface area of the lower face of the light emitting element 10. Nor are there any particular restrictions on the size of the groove G, which can be suitably adjusted according to the size of the light emitting element 10, the size of the mounting board 20, etc. As an example, the depth is from 100 to 500 μm, and the width is from 10 to 100 μm. There are no particular restrictions on the shape of the groove either, but it can be a shape that surrounds the outer periphery of the mounting portion A in a circular ring shape, for example. The groove G can be provided discontinuously around the mounting portion A, or can be provided at just part of the periphery of the mounting portion A. Also, the position of the groove G can be suitably adjusted so that the outer periphery of the light emitting element 10 will be less prone to emission. Also, the cover layer 50 can be formed from inside the groove G to the upper face of the mounting portion A. This results in good point light source attributes, and in a case where the cover layer 50 is reflective, this results in a light emitting device with higher reflectivity near the light emitting element 10.

This mounting board 20 can be produced in the board preparation step. This mounting board 20 can be produced by laminating the mounting portion A use base 1b and the outer peripheral base 1c over the base 1a, and providing the conductive members 2c over the base 1c and the conductive members 2a, 2b over the base 1b. The bases that are laminated may be bonded by a resin, solder paste, or another such joining member, for example. The conductive members 2a, 3b, and 2c can be formed after part of one base is removed to form the groove G. Alternatively, the groove G can be formed by removing part of the mounting board 20 in which the groove G is not formed.

In this embodiment, the conductive members 2c are formed over the base 1c, and the cover layer 50 is formed on the surface of the phosphor layer 40 over these conductive members 2c. Here, the cover layer 50 is also formed on the side surface (on the groove G side) of the phosphor layer 40 over the conductive members 2c. However, the cover layer 50 may be formed on just the surface of the phosphor layer 40 over the conductive members 2c. Furthermore, the cover layer 50 can be formed on the bottom face of the groove G. The conductive members 2a, 2b on the base 1b may not be electrically connected to the conductive members 2c on the base 1c.

Embodiment 4

Figure 5:
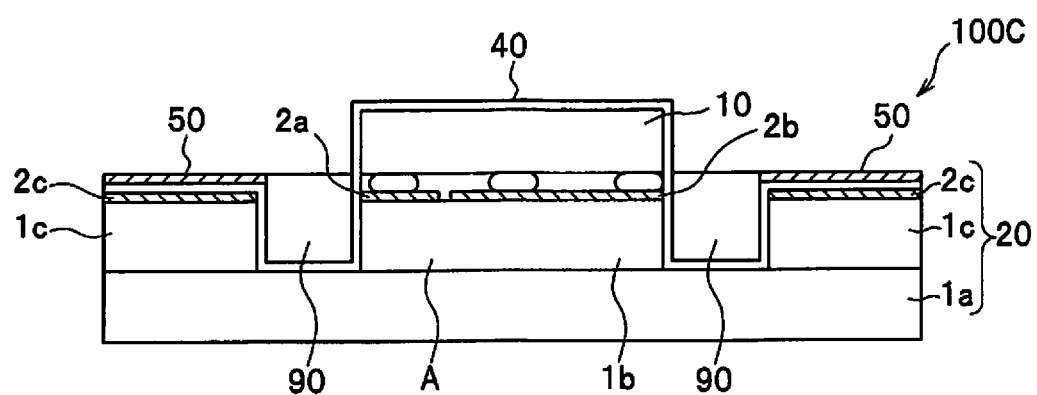
FIG. 5 is a simplified cross section of the light emitting device pertaining to still another embodiment of the present disclosure.

Furthermore, with the light emitting device 100B above, a light reflecting member can be embedded in the groove G. As shown in FIG. 5, a light emitting device 100C has a light reflecting member 90 embedded in the groove G (see FIG. 4). With this configuration, emitting light from phosphor adhering to the groove G can be reduced, the point light source attributes can be improved. Also, the light reflecting member 90 result in better point light source attributes and also increase reflectivity of the area near the light emitting element 10.

The embedding of the light reflecting member 90 can be performed in a light reflecting member embedding step, in which the light reflecting member is embedded in the groove G, following the phosphor layer formation step. The embedding of the light reflecting member can be accomplished by injecting the light reflecting member into the groove G. The embedding of the light reflecting member 90 can be performed before the cover layer formation step and after the phosphor layer formation step, or can be performed after the cover layer formation step. In a case where the cover layer 50 is formed in the groove then the light reflecting member can cover the cover layer 50.

The light reflecting member 90 can be formed by using a resin discharge device (not shown) that can move horizontally or in up and down direction etc. with respect to the mounting board 20, on the upper side of the fixed mounting board 20, for example (see, JP2009-182307A).

An insulating material is preferably used as the material for the light reflecting member 90. A thermosetting resin, a thermoplastic resin, or the like can be also used to ensure a certain amount of strength, for example. Specific examples of the insulating material include a phenolic resin, an epoxy resin, BT (bismaleimide-triazine) resin, polyphthalamide (PPA), a silicone resin, and the like. Light can be reflected more efficiently by dispersing a reflecting member (such as $TiO_2$, $Al_2O_3$, $ZrO_2$, MgO) or the like, which is less likely to absorb the light emitted from the light emitting element 10, with a large refractive index differential with respect to the matrix resin.

Embodiment 5

Light Emitting Device

Figure 6A:
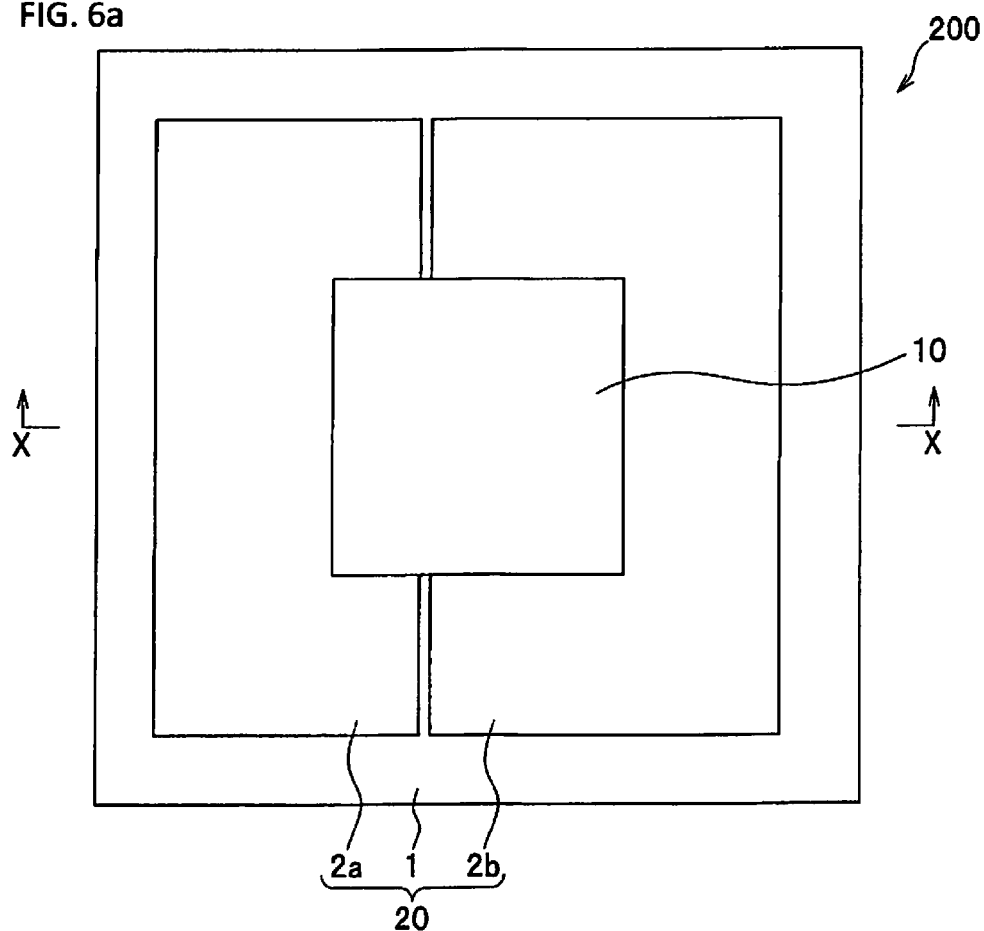
FIG. 6a is a simplified plan view diagram of the light emitting device pertaining to still another embodiment of the present disclosure.
Figure 6B:
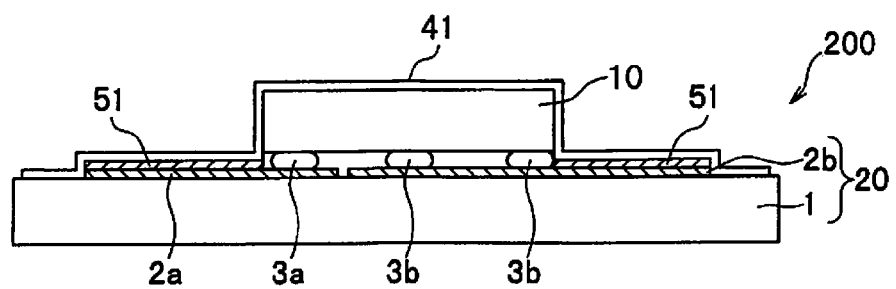

As shown in FIGS. 6a and 6b, a light emitting device 200 here mainly includes a base 1, conductive members 2a, 2b provided on the base 1, conductive joining member 3a and 3b provided on the conductive members 2a, 3b, a light emitting element 10 provided on the bumps 3a and 3b, a cover layer 51 provided on the surface of a board (mounting board) 20, a phosphor layer 41 provided to the surface of the light emitting element 10 and the surface of the cover layer 51. The phosphor layer 41 and the cover layer 51 shown in FIG. 6b are not shown in FIG. 6a in order to facilitate an understanding of the configuration of the present embodiment.

Conductive Members

In a case where the cover layer formation step (discussed below) is performed by electrophoretic coating, the conductive members 2a, 2b can also be used as electrodes for forming the cover layer.

Cover Layer

In this embodiment, the cover layer 51 is a light reflecting layer. The cover layer 51 contains a light reflecting material that reflects at least part of the light from the light emitting element 10.

The cover layer 51 here is provided to the surface of the conductive members 2a, 2b. Specifically, the cover layer 50 is provided at a location nearer the light emitting element 10 on the mounting board 20. The cover layer 51 is provided so as to be located around the light emitting element 10. The phrase "around the light emitting element 10" refers to a place or an area that is near the light emitting element 10, and where reflectivity is increased so that the desired light extraction efficiency can be obtained. For example, it refers to a region about 5 to 500 µm to the outer periphery from under the light emitting element 10 toward the outer periphery.

Providing the cover layer 51 to the surface of the conductive members 2a, 2b increases reflectivity near the light emitting element 10, and results in a light emitting device with good light extraction efficiency. This effect is further enhanced by providing the cover layer 51 even closer to the light emitting element 10.

The cover layer 51 is provided at a place on the surface of the mounting board 20 where the light emitting element 10 is not mounted. The "place where the light emitting element 10 is not mounted" referred to here is a place other than directly under the light emitting element 10 on the surface of the mounting board 20. That is, it is a place outer periphery of the light emitting element 10 in a plan view.

Phosphor Layer

The phosphor layer 41 formed by spraying tends to be formed on the surface of the mounting board 20 as well as the surface of the cover layer 51. Accordingly, the phosphor layer 41 in this embodiment is also formed on the surface of the mounting board 20 other than the place where the light emitting element 10 is placed and the surface of the cover layer 51. However, in the light of improving point light source attributes, the surface area of the phosphor layer 41 on the mounting board 20 is preferably as small as possible.

The phosphor layer 41 is formed as a plurality of layers in a substantially uniform thickness on the surface of the light emitting element 10 and the cover layer 51. In this embodiment, the phosphor layer 41 is composed of a plurality of layers formed in a substantially uniform thickness also on the surface of the base 1.

Figure 7:
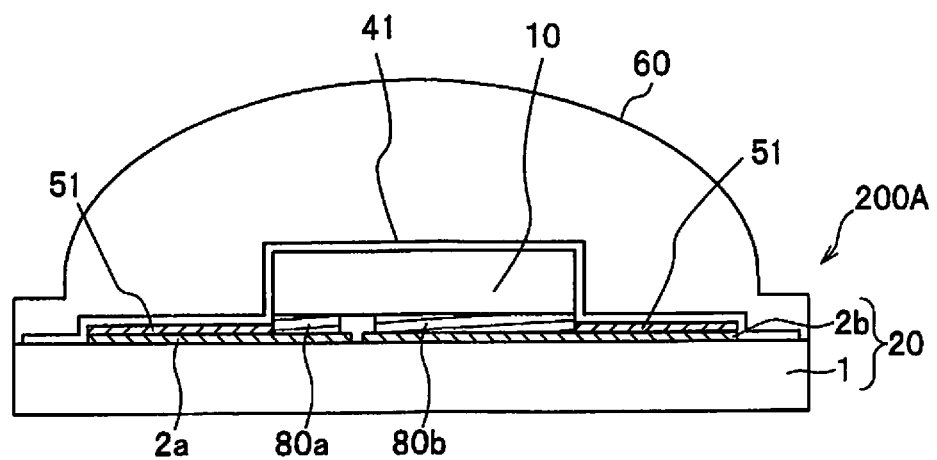
FIG. 7 is a simplified cross section of the light emitting device pertaining to still another embodiment of the present disclosure.

The light emitting element 10, the phosphor layer 41, and the cover layer 51 described above are preferably sealed with a light transmissive resin or another such sealing member 60 as shown in FIG. 7, for example.

The rest of the configuration is substantially the same as that of the light emitting device 100 in Embodiment 1.

With the light emitting device 200 of the present embodiment described above, when the light emitting device 200 is driven, of the light traveling in all directions from the light emitting element 10, the light that is traveling upward is extracted to the outside above the light emitting device 200. The light traveling downward, to the side, etc., is reflected and scattered by the cover layer 51, the surface of the base 1, the conductive members 2a, 3b, a resist film, etc., and is extracted to the outside above the light emitting device 200. Furthermore, reflectivity of the area near the light emitting element 10 can be increased, and the light extraction efficiency can be improved.

Method for Manufacturing Light Emitting Device

The method for manufacturing the light emitting device 200 pertaining to the present embodiment includes a die bonding step, a cover layer formation step, and phosphor layer formation step, in that order.

The board preparation step and the die bonding step are substantially the same as in the method for manufacturing a light emitting device in Embodiment 1.

Cover Layer Formation Step

In this embodiment, the cover layer formation step is a step of forming the cover layer 51 that contains a light reflecting material at a place on the surface of the mounting board 20 wherein the light emitting element 10 is not mounted, after the mounting of the light emitting element 10.

Phosphor Layer Formation Step

In this embodiment, the phosphor layer formation step is a step of forming the phosphor layer 41 that contains a phosphor by spraying on the surface of the light emitting element 10 and the cover layer 51 after the cover layer formation step.

Other than the above-mentioned steps, the manufacturing steps are substantially the same as in Embodiment 1 above.

Embodiment 6

As shown in FIG. 7, a light emitting device 200A is such that the conductive members 2a, 2b and the light emitting element 10 are joined by joining members 80a and 80b.

With the light emitting device 200 described above, the light emitting element 10 is placed on the conductive members 2a, 2b with the bumps 3a and 3b in between them. As shown in FIG. 7, however, the joining members 80a and 80b such as an eutectic or a resin material can be used to place the light emitting element 10 on the conductive members 2a, 2b.

The rest of the configuration is substantially the same as that of the light emitting device in Embodiments 1, 2 and 5.

Embodiment 7

Figure 8A:
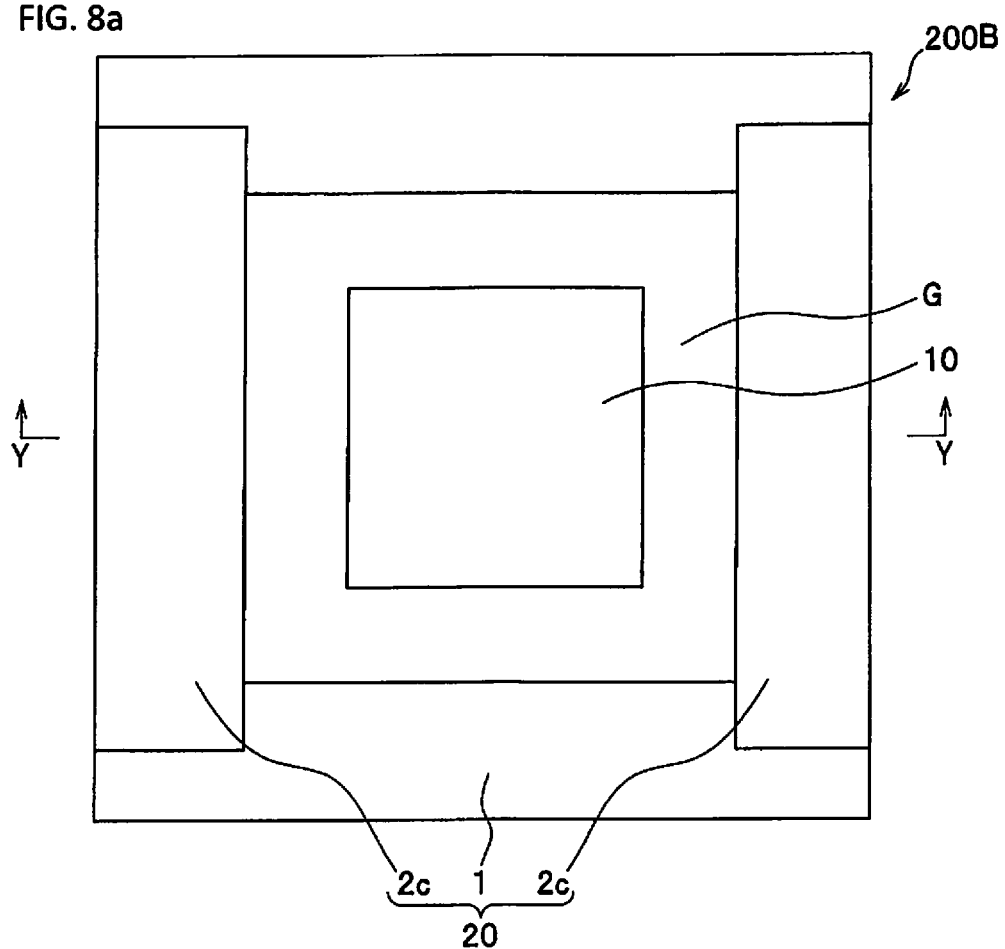
FIG. 8a is a simplified plan view diagram of the light emitting device pertaining to still another embodiment of the present disclosure.
Figure 8B:
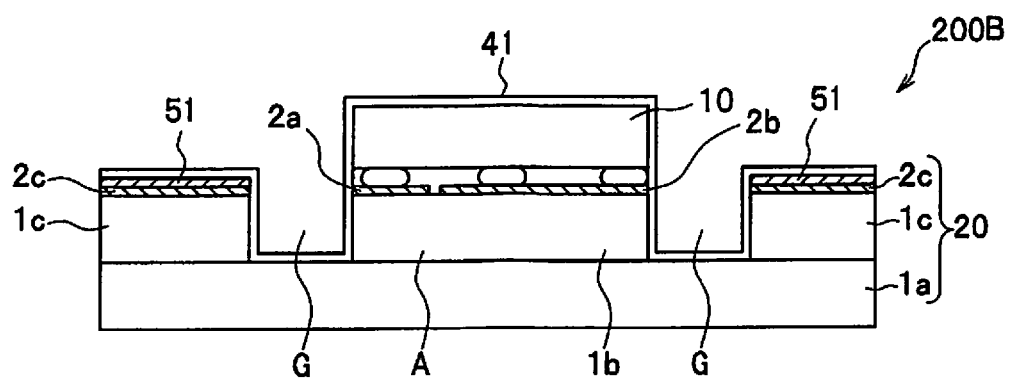

As shown in FIGS. 8a and 8b, a light emitting device 200B has a mounting portion A on which light emitting device 10 is mounted, and a groove G formed surrounding the outer periphery of the mounting portion A, on the mounting board 20.

The light emitting device 200B has the groove G formed in the mounting board 20 around the light emitting element 10, which increases reflectivity of the area near the light emitting element 10, and the phosphor layer 41, which is formed in a uniform thickness by spraying, is disposed within the groove G surrounding the light emitting element 10, which makes it less likely that the phosphor layer 41 around the light emitting element 10 will emit light, resulting in good point light source attributes. Furthermore, because the cover layer 51 of the light emitting device 200B is formed on the upper face of the base 1c around the groove G, reflectivity of the area near the light emitting element 10 can be increased.

The cover layer 51 can be formed on the surface of the phosphor layer 41 from inside the groove G to the upper face of the mounting portion A. This further increases reflectivity near the light emitting element 10 and on the base 1c, and results in a light emitting device with even better point light source attributes.

The conductive members 2c are formed on the base 1c, and the phosphor layer 41 is formed on the surface of the cover layer 51 over these conductive members 2c. The cover layer 51 also can be formed on the bottom face of the groove G. The conductive members 2a, 2b on the base 1b, and the conductive members 2c on the base 1c need not be electrically connected.

Otherwise, the configuration is substantially the same as that of the light emitting device in Embodiment 5 above.

Embodiment 8

Figure 9:
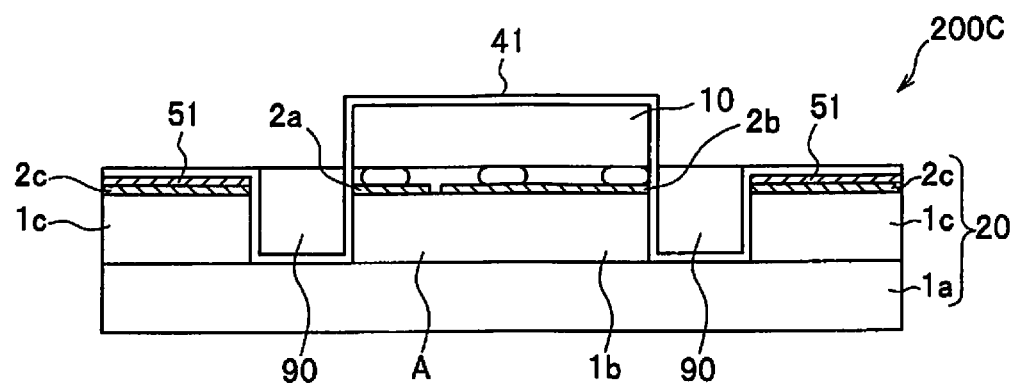
FIG. 9 is a simplified cross section of the light emitting device pertaining to still another embodiment of the present disclosure.

With the light emitting device 200B, a light reflecting member can be embedded in the groove G to which the phosphor layer 41 is provided. As shown in FIG. 9, a light emitting device 200C has the light reflecting member 90 embedded in the groove G (see FIG. 8). With this configuration, the light reflecting member 90 further increases reflectivity of the area near the light emitting element 10. Also, since light emitting from phosphor adhering to the groove G is reduced, the point light source attributes are even better.

The embedding of the light reflecting member 90 can be performed in a light reflecting member embedding step, in which the light reflecting member is embedded in the groove following the phosphor layer formation step. If the cover layer 51 is formed on the surface of the phosphor layer 41 within the groove G, then the light reflecting member can cover the cover layer 51.

Otherwise, the configuration is substantially the same as that of the light emitting device in Embodiment 5 above.

Others

A resist film that protects the base 1 or the conductive members 2a, 2b can be provided to the surface of the conductive members 2a, 2b and/or the base 1. This resist film is preferably a reflective film that enhances optical reflectivity. The material of this film can be a white insulating material such as a silicone resin containing titanium oxide. Printing is a preferable way to form this resist film.

The light emitting device 100, 100B, 100C, 200, 200B and 200C can include an underfill between the light emitting element 10 and the upper face of the base 1. Providing an underfill improves optical characteristics such as light extraction efficiency, and improves heat dissipation in the light emitting device 100, 100B, 100C, 200, 200B and 200C, which lessens mechanical stress and thermal expansion between the light emitting element 10 and the base 1. Accordingly, the reliability of the light emitting device 100, 100B, 100C, 200, 200B and 200C can be improved. The material of this underfill can be, for example, a silicone resin, an epoxy resin, or another such thermosetting resin.

The light emitting device 100, 100B, 100C, 200, 200B and 200C can include a protective element that protects the light emitting element 10 (such as a Zener diode). This prevents electrostatic breakdown in the light emitting element 10. The protective element may be electrically connected to the conductive members 2a, 3b, so the step of mounting the protective element is preferably performed before the phosphor layer formation step and the cover layer formation step. Also, the protective element can be covered by the phosphor layer 40 or 41 and/or the cover layer 50 or 51. This reduces the absorption of light by the protective element, and raises the light extraction efficiency of the light emitting device. The protective element can be mounted by a combination of die bonding and wire bonding, or can be flip-chip mounted, but it is preferable not to use a wire, and to use flip-chip mounting so that light emitted from the light emitting element 10 will be less likely to be blocked.

The protective element is preferably placed away from the light emitting element 10. This makes it less likely that the phosphor layer 40 or 41 will stick to the protective element, so the height at which the cover member formed over the phosphor layer 40 or 41 can be kept low. An example of such a configuration is one in which there are extensions where the conductive members 2a, 2b extend from near the light emitting element 10, and the protective element is mounted to these extensions.

The light emitting device 100, 100A, 100B, 100C, 200, 200A, 200B and 200C having the bumps 3a and 3b or the joining members 80a and 80b, but the light emitting device need not include these.

The mounting board 20 of above embodiments consists of the base 1 and the conductive members 2a, 3b, but the mounting board can consist of just the conductive members 2a, 2b.

The conductive members 2c of the light emitting device 100B, 100C, 200B and 200C can be configured substantially the same as the conductive members 2a, 2b.

The method for manufacturing a light emitting device can include steps other than those described above, either before, after, or in between the above steps. For instance, other steps that can be included are a base washing step of washing the base, a debris removal step of removing any dirt or other such debris, and a mounting position adjustment step of adjusting the mounting position of the bumps or the light emitting element.

What is claimed is:

1. A light emitting device, comprising:
    a board;
    a light emitting element mounted on the board;
    a phosphor layer composed in a substantially uniform thickness of a plurality of layers formed on surfaces of the light emitting element and the board; and
    a cover layer that covers the phosphor layer over the board and contains at least one type of light reflecting material and light blocking material,
    the phosphor layer being located on or above the light emitting element has a region where the cover layer is not provided.

2. The light emitting device according to claim 1, wherein,
    the board has a mounting portion on which the light emitting element is mounted and a groove formed surrounding an outer periphery of the mounting portion.

3. The light emitting device according to claim 2, further comprising
    a light reflecting member embedded in the groove.

4. The light emitting device according to claim 1, wherein the thickness of the phosphor layer is from 10 μm to 200 μm.

5. The light emitting device according to claim 1, wherein the number of each layer in the plurality of layers of the phosphor layer is 1 to 20.

6. The light emitting device according to claim 1, wherein the thickness of each layer in the plurality of layers of the phosphor layer is from 5 μm to 20 μm.

7. The light emitting device according to claim 1, wherein the thickness of the cover layer is from 10 μm to 30 μm.

8. The light emitting device according to claim 1, wherein the cover layer is formed as a single member, or as multiple layers.

9. The light emitting device according to claim 1, wherein the cover layer includes a binder, a color fixative, a light diffusing agent, or a filler.

10. The light emitting device according to claim 1, wherein the light emitting element, the phosphor layer, and the cover layer are sealed with a transmissive resin or other such sealing member.

11. The light emitting device according to claim 10, wherein the transmissive resin is a hemispherical shape.

12. The light emitting device according to claim 10, wherein the transmissive resin is in a shape that combines a substantially cuboid shape, a hemispherical shape, and a plurality of hemispheres.

\* \* \* \* \*